US008513639B2

(12) United States Patent
Cai et al.

(10) Patent No.: US 8,513,639 B2
(45) Date of Patent: Aug. 20, 2013

(54) RESISTIVE-SWITCHING MEMORY AND FABRICATION METHOD THEREOF

(75) Inventors: Yimao Cai, Beijing (CN); Ru Huang, Beijing (CN); Yangyuan Wang, Beijing (CN); Yinglong Huang, Beijing (CN)

(73) Assignee: Peking University, Beijing (CN)

( * ) Notice: Subject to any disclaimer, the term of this patent is extended or adjusted under 35 U.S.C. 154(b) by 147 days.

(21) Appl. No.: 13/254,570

(22) PCT Filed: Apr. 12, 2011

(86) PCT No.: PCT/CN2011/072639
§ 371 (c)(1),
(2), (4) Date: Sep. 2, 2011

(87) PCT Pub. No.: WO2012/126186
PCT Pub. Date: Sep. 27, 2012

(65) Prior Publication Data
US 2012/0241712 A1    Sep. 27, 2012

(30) Foreign Application Priority Data
Mar. 23, 2011  (CN) .......................... 2011 1 0070280

(51) Int. Cl.
*H01L 47/00*    (2006.01)
(52) U.S. Cl.
USPC .. 257/4; 438/133; 257/E45.003; 257/E47.001

(58) Field of Classification Search
USPC ............. 257/4, 536, 537, E45.002, E45.003, 257/E47.001; 438/133, 381, 382
See application file for complete search history.

(56) References Cited

U.S. PATENT DOCUMENTS
7,863,087 B1 *    1/2011    Kumar et al. ................ 438/104

FOREIGN PATENT DOCUMENTS
CN    1449062 A      10/2003
CN    101288187 A    10/2008
CN    102157692 A    8/2011

* cited by examiner

*Primary Examiner* — David Vu
(74) *Attorney, Agent, or Firm* — Bozicevic, Field & Francis LLP; Bret E. Field

(57) ABSTRACT

The present invention discloses a resistive-switching memory and the fabrication method thereof. The resistive-switching memory comprises a substrate, a top electrode, a bottom electrode, and a resistive-switching material interposed between the top and bottom electrodes, wherein the central portion of the bottom electrode protrudes upwards to form a peak shape, and the top electrode is in a plate shape. The peak structure of the bottom electrode reduces power consumption of the device. The fabrication method thereof comprises forming peak structures on the surface of the substrate by means of corrosion, and then growing bottom electrodes thereon to form bottom electrodes having peak shapes, and depositing resistive-switching material and top electrodes. The entire fabrication process is simple, and high integration degree of the device can be achieved.

10 Claims, 3 Drawing Sheets

RESISTIVE-SWITCHING MEMORY AND FABRICATION METHOD THEREOF

FIELD OF THE INVENTION

The present invention relates to a resistive-switching memory, in particular to a structure of resistive-switching memory with low power consumption, and a fabrication method thereof. The present invention belongs to a technical field of a structure of nonvolatile memory in CMOS ultra large scale integrated circuit (ULSI), and a fabrication thereof.

BACKGROUND OF THE INVENTION

Solid-state memory devices are playing very important roles in the modern information-based society. They exist in most of electronic products used in our daily life, including personal computers, mobile phones, cameras, audio players, automotive systems and global positioning systems, etc. Depending on whether or not data can be retained after powered off, memory devices may be mainly divided into two types: nonvolatile memory and volatile memory. The volatile memory is not capable of retaining data after powered off, while the nonvolatile memory can retain data even though the power is turned off.

Conventional memories are mainly based on magnetic memories and optical memories. Novel memory devices based on the semiconductor technology have gradually taken the dominant position in the memory market due to their great advantages. In particular, the emergence of dynamic random access memory (DRAM) and flash memory leads to a revolution in the field of memory. However, with the continuous development in the semiconductor industry, the size of the device is reduced continuously, and the DRAM as well as the flash memory will be shrunk to their physical limits. In particular, after entering a 22 nm technology node, disadvantages of these two types of devices have emerged, so that they are not able to meet requirements for the development of memory device. Various novel memory structures have been put forward, such as a ferroelectric memory, a magnetic memory, a phase change memory and a resistive-switching memory, etc., in which the resistive-switching memory has become a hot topic due to the advantages such as low cost, high speed, and low voltage, etc.

The resistive-switching memory (RRAM) is a brand-new nonvolatile memory, and its resistance value may be switched reversibly between a high resistance status and a low resistance status by applying an external electric field, so that the information storage is achieved. In the RRAM, the resistive-switching material may present two resistance states completely different form each other (low resistance state and high resistance state) under the same read voltage, and both of the resistance states can be retained for a long time after the erase voltage is removed, so that the nonvolatile storage of data may be achieved. The RRAM comprises a plate capacitor structure in which a layer of the resistive-switching material is interposed between two metal electrodes. The RRAM has become the most promising competitor for the next-generation memory due to its simple structure and excellent performance, and therefore it is paid close attention and studied widely.

Currently, researches on the RRAM are mainly focused on the selection and preparation of the resistive-switching material and the metal electrode. As for the resistive-switching material, resistive-switching characteristics of transition metal oxides, perovskite oxides, rare metal oxides and ferromagnetic materials have been studied. As for the electrode, influences of various electrode metal materials on resistive-switching characteristics of RRAM have been studied. Great progress has been made regarding the RRAM device. The RRAM is turned on mainly depending on the movement of oxygen vacancies inside the resistive-switching material or the movement of metal ions in the gate by which a conductive path is formed so that the resistive-switching material is switched from a high resistance state to a low resistance state.

A metal-resistive-switching-material-metal (MIM) plate capacitor structure is adopted in conventional RRAM structures, as shown in FIG. 1. The structure mainly consists of a top electrode 1, a bottom electrode 3 and a resistive-switching material 2 interposed between the top and bottom electrodes. The operation states are as follows: the resistive-switching material exhibits a high resistance state in an initial state; when the voltage between the two electrode plates is increased to a certain value, the current between the electrode plates is increased drastically and the resistive-switching material is switched into a low resistance state, and the voltage at this time is referred to as Vset; and after the applied voltage reaches a certain value, the current between the two electrode plates is decreased drastically, and the voltage at this time is referred to as Vreset. The reason that the current of the RRAM device is increased drastically is mainly due to the conductive path formed within the resistive-switching material. When the voltage is increased to Vset, oxygen vacancies or charged metal ions in the material are moved by application of the internal electric field, and thus a conductive path is formed locally between the top and bottom electrodes, so that the current is increased drastically. When the voltage becomes Vreset, the current is increased drastically due to the very low resistance at this time, so that the path is fused and the resistive-switching material switches into high resistance state, and then the current is decreased drastically. The top and bottom electrodes of the conventional RRAM adopt a plate structure, and the electric field is distributed uniformly between the two electrode plates. Since the electrodes may be uneven locally, the electric field of relatively high intensity is locally formed to lead a movement of ions, so that a conductive path is formed. However, the position where such conductive path is formed is random, so it is disadvantageous to the stability of the RRAM performance. Moreover, the voltage Vset is relatively high, which is disadvantageous to reducing the power of the device. Therefore, it is necessary to locate the position of the electric field intensity through an appropriate structure.

SUMMARY OF THE INVENTION

In view of above-mentioned problems, an object of the present invention is to change a plate-capacitor structure of a conventional RRAM and to propose a novel structure to reduce power consumption of the device.

A technical solution of the present invention is as follows:

A resistive-switching memory comprises a substrate, a top electrode, a bottom electrode, and a resistive-switching material interposed between the top electrode and the bottom electrode, wherein the bottom electrode is arranged on the substrate, and a central portion of the bottom electrode protrudes upwards to form a peak shape; and the top electrode is arranged on a top portion of the device and is in a plate shape.

In the above-mentioned resistive-switching memory, a peak structure may be formed on a surface of the substrate, and the bottom electrode covers the peak structure of the substrate surface.

Furthermore, in the above-mentioned resistive-switching memory, m bottom electrode stripes each having a peak-shaped cross section are arranged in parallel on the surface of the substrate; n top electrode bands in a plate shape are arranged in parallel on top of the device; a resistive-switching material is interposed between the bottom electrode stripes and the top electrode bands; a cross-bar structure is formed by arrangement directions of the top electrode bands and the bottom electrode stripes; each intersection point forms a memory cell, and the total number of the memory cells is m×n, wherein m and n are positive integers.

Preferably, in the above-mentioned resistive-switching memory, a series of stripe-shaped serration structures arranged in parallel are formed on the surface of the substrate, and the bottom electrode stripes each having a cross section in a shape of "⌃" cover the stripe-shaped serration structures.

The above-mentioned substrate is a Si substrate having a crystal orientation of (100), and the above-mentioned bottom electrode and top electrode are formed of a conductive metal or a metal nitride, such as Pt, Al, Cu, TiN, or the like. The resistive-switching material may be any one of conventional resistive-switching materials, including metal oxides (such as $Al_2O_3$, $WO_x$ and $SrTiO_x$, etc) and silicides (such as $SiO_x$, $SiN_x$ and $SiO_xN_y$, etc).

A resistive-switching memory according to the present invention may be fabricated through following method:

1) forming stripe-shaped serration structures on a surface of a substrate;

2) performing a photolithography to define patterns for bottom electrodes, and then depositing electrode material to cover peaks of the serration structures on the surface of the substrate, so that peak-shaped bottom electrodes are formed;

3) depositing a resistive-switching material to completely cover the bottom electrodes, and performing chemical mechanical polishing to planarize a surface thereof;

4) forming plate-shaped top electrodes on the resistive-switching material.

Furthermore, in the step 1), a layer of mask material (generally a silicon nitride, or may be $SiO_2$) is first formed on the silicon substrate, and a hard mask in a band shape is formed by performing photolithography and etching with respect to the mask material, and then corroding the surface of the silicon substrate by means of KOH, so that a series of stripe-shaped serrations arranged in parallel are formed on the surface of the substrate.

In the step 2), a series of bottom electrode stripes arranged in parallel each having a cross section in a shape of "⌃" are formed on the surface of the substrate having stripe-shaped serration structures.

In the step 4), patterns for the top electrodes are defined by photolithography to be a series of band-shaped patterns arranged in parallel, wherein arrangement directions of the formed top electrode bands and the bottom electrode stripes form a cross-bar structure.

The structure of RRAM according to the present invention has modified a conventional plate-capacitor structure. Peak structures are formed on the surface of the substrate by corrosion, and then bottom electrodes of RRAM are grown thereon to form peak-shaped bottom electrodes, and resistive-switching material and top electrodes are deposited. The major advantages are described as follows:

(1) It is easy to implement the fabrication process. The peak-shaped bottom electrodes are formed through corrosion of the substrate and deposition.

(2) The peak-shaped bottom electrodes reduce power consumption of the RRAM device (i.e., the Vset is reduced). A strong electric field may be formed between the peak portion of the bottom electrode and the top electrode, where a conductive path for ions may be formed more easily, so that the Vset voltage of RRAM is reduced. A conductive metal or a metal nitride is used as electrode material, and resistive-switching material in the form of metal oxide (such as $Al_2O_3$, $WO_x$ and $SrTiO_x$, etc) and silicide (such as $SiO_x$, $SiN_x$ and $SiO_xN_y$, etc) may be used as the resistive-switching material.

(3) A high integration degree of the device may be achieved. The structure in which the bottom electrodes and the top electrodes form a cross-bar structure may be adopted. Each intersection point at which the top electrode and the bottom electrode are crossed over each other forms a memory cell of RRAM, thus a very high integration degree may be achieved.

BRIEF DESCRIPTION OF THE DRAWINGS

FIG. 3 to FIG. 8 are specific flow charts illustrating the fabrication of an RRAM according to the present invention, wherein:

FIG. 3 is a schematic view illustrating a structure of silicon nitride hard mask stripes formed on the silicon substrate by deposition;

FIG. 4 is a schematic view illustrating a process of KOH corrosion;

FIG. 5 is a schematic view illustrating formation of the serration-shaped silicon substrate;

FIG. 6 is a schematic view of a resultant device which has been subjected to formation of bottom electrodes on the substrate by photolithography;

FIG. 7 is a schematic view of a resultant device which has been subjected to deposition of a resistive-switching material and chemical mechanical polishing; and FIG. 8 is a schematic view of a resultant device which has been subjected to deposition of a metal top electrode.

DETAILED DESCRIPTION OF THE EMBODIMENTS

The present invention is further described through embodiments with combination of the accompanying drawings.

Figure 1:
FIG. 1 is a schematic view illustrating a structure of a memory cell in a conventional RRAM, wherein 1 refers to a metal top-electrode, 2 refers to a resistive-switching material, 3 refers to a metal bottom-electrode and 4 refers to a silicon substrate.
Figure 2:
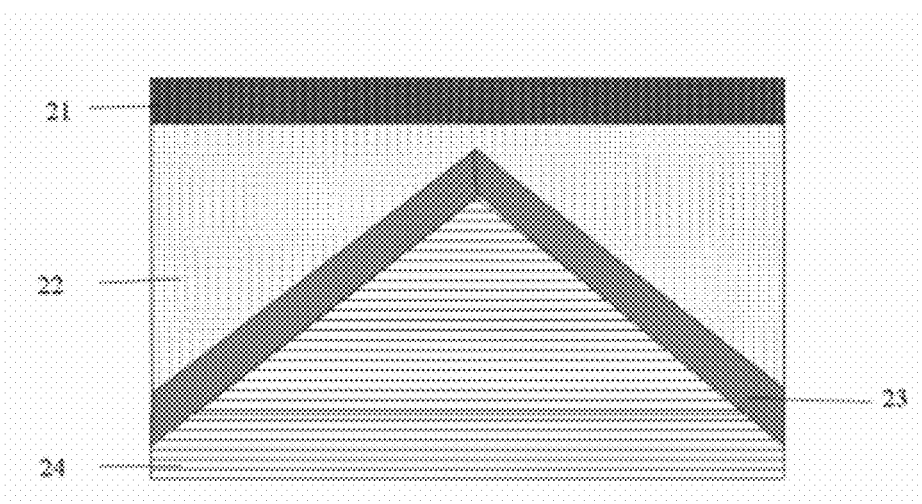
FIG. 2 is a schematic view illustrating a structure of a memory cell in an RRAM according to the present invention, wherein 21 refers to a top electrode, 22 refers to a resistive-switching material, 23 refers to a bottom electrode and 24 refers to a substrate.

As shown in FIG. 2, a memory cell of a fabricated RRAM comprises a substrate 24 having a peak structure, a bottom electrode 23 covering the peak structure of the substrate, a top electrode 21 having a plate structure located on the top thereof, and a resistive-switching material 22 interposed between the top and bottom electrodes. The RRAM is fabricated on the basis of following steps:

1. Preparation of a Substrate

Figure 3:
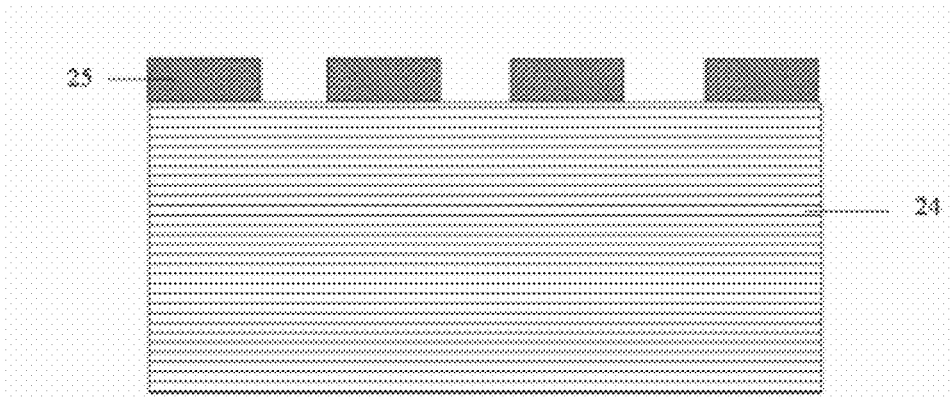
Figure 4:
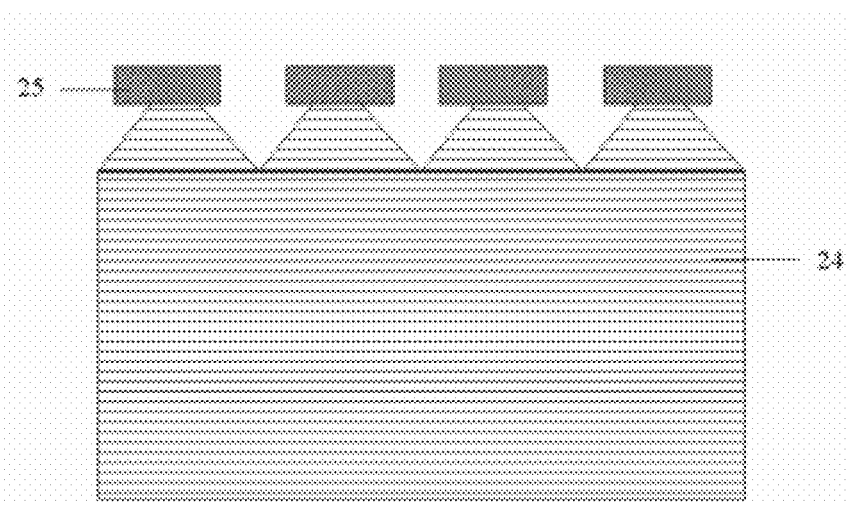
Figure 5:
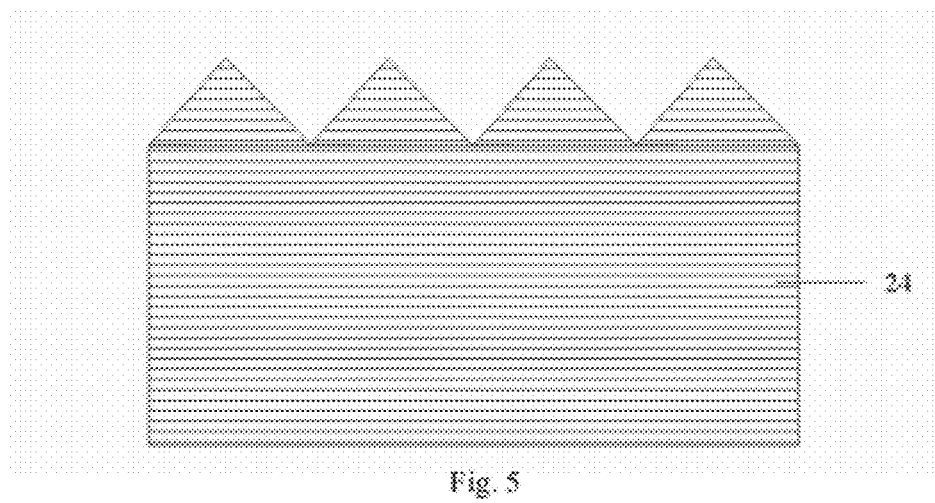

A Si(100) substrate 24 is used. A silicon nitride layer having a thickness of 300 nm is grown on a surface of the Si substrate through chemical vapor deposition (CVD). Photolithography is performed on the silicon nitride layer to form stripe-shaped silicon nitride, with a width of about 1 μm (see FIG. 3), so as to be used as a corrosion hard mask 25. Then, the surface of the Si substrate is corroded by means of KOH (see FIG. 4) to form a series of stripe-shaped serrations arranged in parallel on the surface of the substrate. A cross section of the substrate taken along a direction perpendicular to the extending direction of the stripe-shaped serrations is shown in FIG. 5, in which the surface of the substrate is provided with a series of peak structures. The width of each of the peaks on the substrate is controlled by controlling the width of the mask stripes and the corrosion time.

2. Fabrication of the Bottom Electrodes

Figure 6:
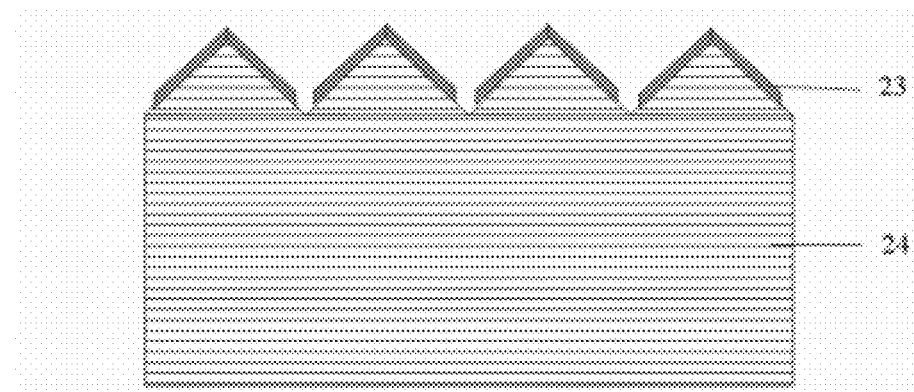
Figure 7:
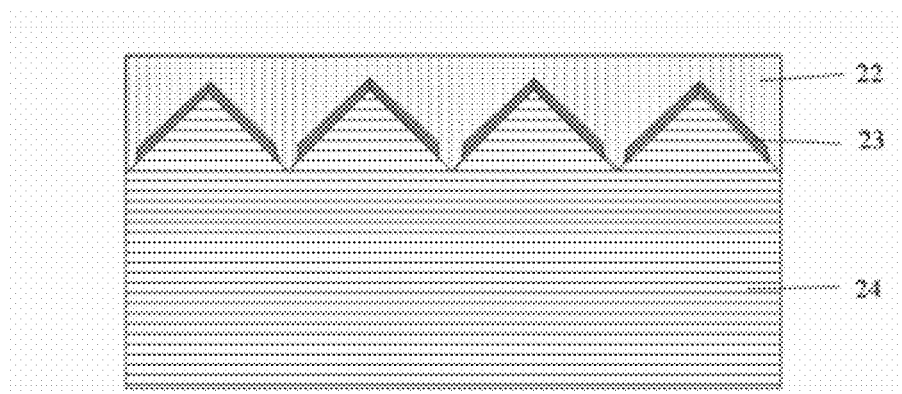
Figure 8:
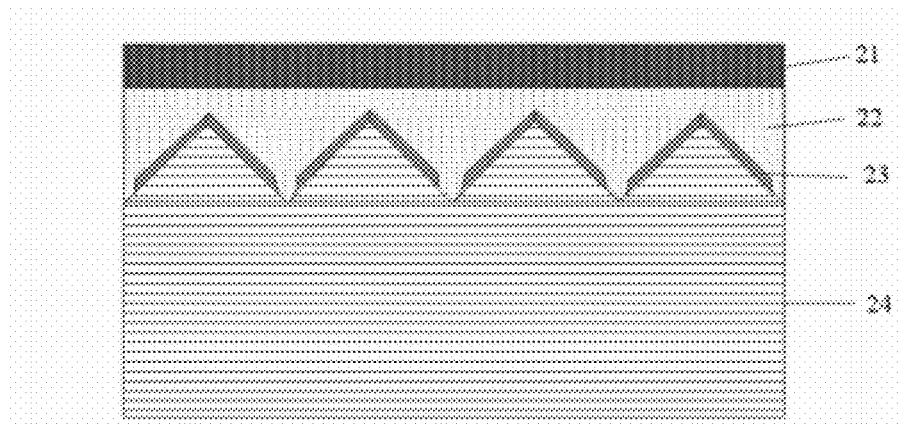

The surface of the resultant serration-shaped substrate is spin-coated with photoresist, with a thickness greater than the height of the peaks on the substrate. Photolithography is performed to define patterns for structures of bottom electrodes. Deposition for the bottom electrodes of the device is performed through a lift-off process as shown in FIG. 6, so that the peak-structured bottom electrodes 23 are formed. The thickness of the metal of the bottom electrodes is about 100 nm.

3. Deposition of the Resistive-Switching Material

After the bottom electrodes 23 are fabricated, a resistive-switching material is subsequently deposited thereon through an atomic layer deposition system, with a thickness greater than the height of the peaks of the bottom electrodes, and chemical mechanical polishing (CMP) is performed so that the surface thereof is planarized. After planarization, the height form the surface of the resistive-switching material 22 to tips of the peaks of the bottom electrodes 23 is controlled to be about 30 nm. The resistive-switching material between the tips of the peaks of the bottom electrodes 23 and the top electrodes is the major portion where the resistive switching occurs.

4. Deposition of the Top Electrode

The deposition for the top electrode formed of band-shaped metal is achieved through a lift-off process. First, the resistive-switching material 22 is spin-coated with photoresist. Photolithography is performed to define patterns for top electrode structures, so as to form a series of band-shaped patterns arranged in parallel, which are crossed over the bottom electrode. Then, metal is sputtered to form the top electrodes, with a thickness of 100 nm. The band-shaped top electrodes 21 and the stripe-shaped bottom electrodes 23 form a cross-bar structure. Each intersection point at which the top and bottom electrodes are crossed over each other forms a memory cell of the RRAM.

Although the present invention has been described hereinbefore in detail by general illustration and specific embodiments, some modifications and improvements can be made on the basis of the present invention, which is obvious to those skilled in the art. Therefore, all of these modifications and improvements made without departing from the spirit of the present invention belong to the protection scope as claimed by the present invention.

What is claimed is:

1. A resistive-switching memory, comprising a substrate, a top electrode, a bottom electrode, and a resistive-switching material interposed between the top electrode and the bottom electrode, wherein the bottom electrode is arranged on the substrate, and the top electrode is arranged on a top portion of the device, characterized in that, a central portion of the bottom electrode protrudes upwards to form a peak shape, and the top electrode is in a plate shape.

2. The resistive-switching memory according to claim 1, characterized in that, a peak structure is formed on a surface of the substrate, and the bottom electrode covers the peak structure of the substrate surface.

3. The resistive-switching memory according to claim 1, characterized in that, m bottom electrode stripes each having a peak-shaped cross section are arranged in parallel on the surface of the substrate; n top electrode bands are arranged in parallel on the top portion of the device; arrangement directions of the bottom electrode stripes and the top electrode bands form a cross-bar structure; each intersection point forms a memory cell, and the total number of the memory cells is m×n, wherein m and n are positive integers.

4. The resistive-switching memory according to claim 3, characterized in that, stripe-shaped serration structures arranged in parallel are formed on the surface of the substrate, and the bottom electrode stripes each having a cross section in a shape of "^" cover the stripe-shaped serration structures.

5. The resistive-switching memory according to any one of claims 1 to 4, characterized in that, the substrate is a Si substrate having a crystal orientation of (100), and materials of the bottom electrode and the top electrode are a conductive metal or a metal nitride.

6. The resistive-switching memory according to any one of claims 1 to 4, characterized in that, the resistive-switching material is metal oxide resistive-switching material or silicide resistive-switching material.

7. A fabrication method of a resistive-switching memory, comprising steps of:
  1) forming a stripe-shaped serration structure on a surface of a substrate;
  2) performing photolithography to define a pattern for a bottom electrode, and depositing electrode material to cover a peak of the serration structure on the surface of the substrate, so that a peak-shaped bottom electrode is formed;
  3) depositing resistive-switching material to completely cover the bottom electrode, and performing chemical mechanical polishing to planarize a surface thereof;
  4) forming a top electrode of a plate shape on the resistive-switching material.

8. The fabrication method according to claim 7, characterized in that, in step 1), a layer of mask material is first formed on a silicon substrate, a hard mask in a band shape is formed by performing photolithography and etching with respect to the mask material, and then the surface of the silicon substrate is corroded by using KOH, so that a series of stripe-shaped serrations arranged in parallel are formed on the surface of the substrate.

9. The fabrication method according to claim 8, characterized in that, in step 2), a series of bottom electrode stripes arranged in parallel each having a cross section in a shape of "^" are formed on the surface of the substrate.

10. The fabrication method according to claim 9, characterized in that, in step 4), patterns for the top electrodes are defined as a series of band-shaped patterns arranged in parallel by performing photolithography, so as to form the top electrode bands, wherein arrangement directions of the top electrode bands and the bottom electrode stripes form a cross-bar structure.

* * * * *